United States Patent
Brauns

[19]

[11] Patent Number: 5,900,747
[45] Date of Patent: May 4, 1999

[54] SAMPLING PHASE DETECTOR

[75] Inventor: Herbert Brauns, Backnang, Germany

[73] Assignee: Robert Bosch GmbH, Stuttgart, Germany

[21] Appl. No.: 09/017,427

[22] Filed: Feb. 2, 1998

[30] Foreign Application Priority Data

Feb. 3, 1997 [DE] Germany ............... 197 03 889

[51] Int. Cl.$^6$ ............................................ G01R 25/00
[52] U.S. Cl. ...................... 327/9; 327/2; 327/583
[58] Field of Search ............................ 327/2, 3, 7, 9, 327/493, 498, 583, 585, 586

[56] References Cited

U.S. PATENT DOCUMENTS 4,810,904 3/1989 Crawford ............................. 307/353

FOREIGN PATENT DOCUMENTS

| 06 11 79 01 | 6/1985 | Japan . |
| 62-051811 | 3/1987 | Japan . |
| 02 20 23 58 | 8/1990 | Japan . |
| 03 01 75 69 | 1/1991 | Japan . |

OTHER PUBLICATIONS

Product Catalog of Alpha Industries Inc., Apr. 22, 1994.

Wilson, M.P., et al: "Fundamental 26GHZ YIG Phase Locked Source", Proceedings of the 23rd, European Microwave Conference, Madris, Sep. 6–9, 1993, Sep. 6, 1993, European Microwave Conference Management Committee, pp. 800–803.

*Primary Examiner*—Timothy P. Callahan
*Assistant Examiner*—Jeffrey Zweizig
*Attorney, Agent, or Firm*—Michael J. Striker

[57] ABSTRACT

The sampling phase detector whose output signal (fd) has a very broad-band and a very even frequency response characteristic includes a step-recovery-diode (SRD) to which a series circuit including at least two diodes (D1,D2) is connected in parallel by means of coupling capacitors (Ck1, Ck2). An input signal is fed to the diodes (D1,D2) by means of an R/C-network (R1,R2,C3,C4) and an output signal (fd) is taken off, which corresponds to the phase shift between an input signal (fo) and a reference signal (fr). The reference signal (fr) is fed to the step-recovery-diode (SRD) via a balancing transformer (Tr). Decoupling resistors (Rs1,Rs2) are included in the connecting lines from the balancing transformer (Tr) to the step-recovery-diode (SRD), which damp interfering resonances or reflections of the balancing transformer.

5 Claims, 1 Drawing Sheet

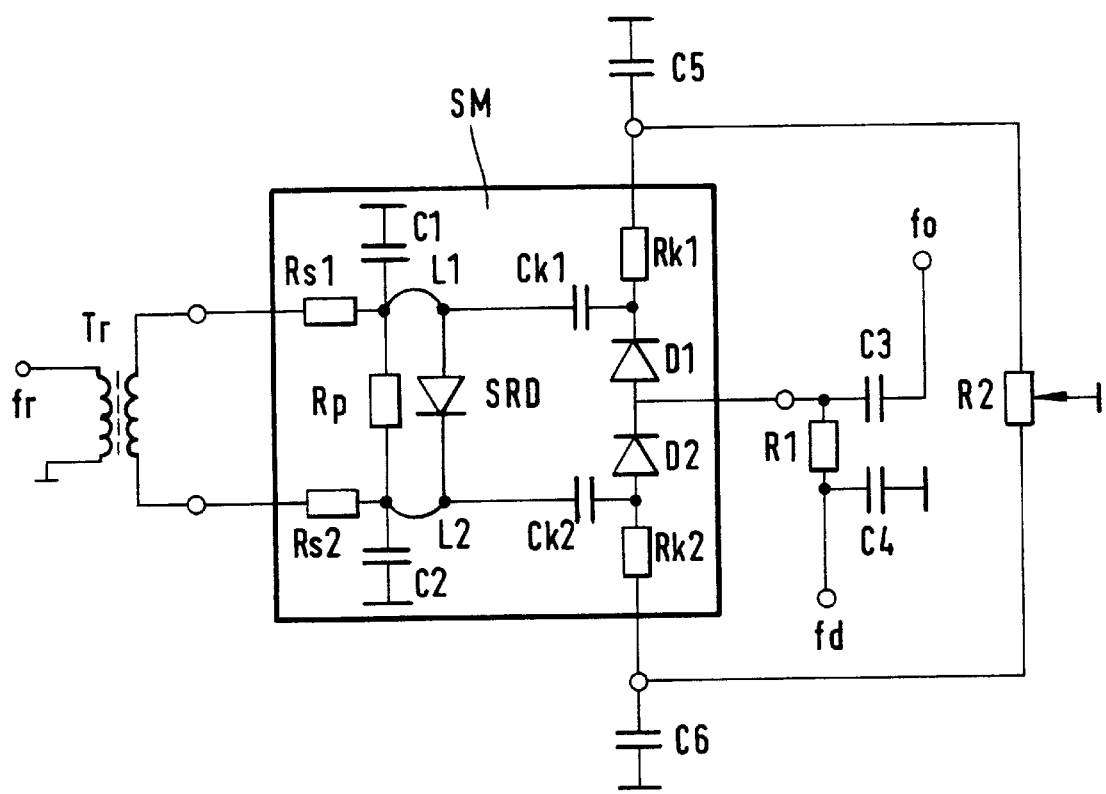

SAMPLING PHASE DETECTOR

BACKGROUND OF THE INVENTION

The present invention relates to a sampling phase detector and, more particularly, to a sampling phase detector comprising a step-recovery-diode, to which a series circuit including at least two diodes is connected in parallel by means of coupling capacitors, in which a balancing transformer is provided which supplies the step-recovery diode with a reference signal, and a decoupling network through which an input signal can be fed to the at least two diodes so that an output signal can be picked off the diodes which is characteristic of a phase shift between the input signal and the reference signal.

This type of sampling phase detector is described in the Product Catalog of Alpha Industries Inc., 1994, pp. 4 to 22. The essential parts of this sampling phase detector, which include the step-recovery- diode and a diode pair connected with it by coupling capacitors, are mounted together on a substrate in film circuit technology. All other circuit components which operate for supplying an input signal, a reference signal and to conduct the output signal, are connected with the diodes found on the substrate by means of conductors. The output signal of this known circuit has a relatively strong frequency dependence and the circuit is not very broad banded.

SUMMARY OF THE INVENTION

It is an object of the present invention to provide a sampling phase detector of the above-described kind, whose output signal has a comparatively smooth frequency response curve or characteristic over as wide as possible a frequency band (2 to 30 GHz).

This object, and others which will be made more apparent hereinafter, is attained in a sampling phase detector comprising a step-recovery-diode, to which a series circuit including at least two diodes is connected in parallel by means of coupling capacitors, in which a balancing transformer is provided which supplies the step recovery diode with a reference signal, and a decoupling network through which an input signal can be fed to the at least two diodes so that an output signal can be picked off the diodes which is characteristic of a phase shift between the input signal and the reference signal.

According to the invention, decoupling resistors are provided in connecting lines to the step-recovery-diode from the balancing transformer and the resistances of the decoupling resistors are chosen so that they damp interfering resonances or reflections between the balancing transformer and the step-recovery-diode.

According to the dependent claims appended hereinbelow, it is appropriate to mount not only the diodes and the coupling capacitors but also the decoupling resistors and an L/C network including a load resistor for charging the step-recovery-diode on a common substrate by film circuit technology. Because of that feed lines to the diodes are extremely short which leads to a very broad band operation of the sampling phase detector. Additional resistors, which damp the interference effecting the diodes, can be mounted on the substrate.

BRIEF DESCRIPTION OF THE DRAWING

The objects, features and advantages of the invention will now be illustrated in more detail with the aid of the following description of the preferred embodiment, with reference to the sole figure which is a schematic circuit diagram of the sampling phase detector according to the invention.

DESCRIPTION OF THE PREFERRED EMBODIMENTS

The circuit shown in the drawing can be used as a sampling phase detector, for example in a phase regulation circuit (PLL).

A module SM, preferably a ceramic substrate, on which the circuit elements are mounted in film circuit technology (thick or thin film technology) is an essential part of the sampling phase detector and is shown with thickened edge lines in the drawing. The module SM has a step-recovery-diode which is connected in parallel with a pair of series-connected diodes D1 and D2 by means of two equal-dimensioned coupling capacitors Ck1 and Ck2.

The step-recovery-diode SRD is controlled by a reference signal fr. The reference signal fr arrives at the step-recovery-diode SRD via a balancing transformer Tr. The terminals of the step-recovery-diode SRD are connected electrically with an L/C network L1, C1 and L2,C2. The step-recovery-diode SRD is charged in each cycle of the reference signal fr, wherein the L/C network L1, C1 and L2 C2 generates a very short charging voltage pulse.

Equal-sized decoupling resistors Rs1 and Rs2 are connected in the conductors from the balancing transformer T5 to the step-recovery-diode. These decoupling resistors Rs1 and Rs2 are just large enough so that resonances due to parasitic elements of the balancing transformer Tr and multiple reflections of the circuit pulses between the step-recovery-diode SRD and the balancing transformer Tr are sufficiently damped. The decoupling resistors Rs1 and Rs2 are however small enough so that the low impedance of the step-recovery-diode SRD is only slightly larger. The required control power of the reference signal fr thus increases only minimally. The described decoupling resistors Rs1 and Rs2 thus provide that there are no interference frequency interruptions in the frequency response curve of the output signal fd.

Both L-C elements or links L1,C1 and L2,C2 are connected to a common load resistor Rp. Oscillations can occur because of the non-linear junction capacitance of the step-recovery-diode in cooperation with other circuit components. These interfering resonances are damped by the load resistor Rp.

Each time the step-recovery-diode SRD has received a charge each period of the reference signal fr, a comparatively rapid discharge pulse occurs which is conducted by means of the coupling capacitors Ck1,Ck2 to the diode pair D1 and D2. This discharge pulse connects the diode pair D1 and D2. A diode arrangement comprising more than two diodes can be used instead of a diode pair. The phase state of an input signal fo applied to the diodes D1 and D2 is detected by the switch operations of the diodes D1 and D2. An R/C network R1, R2, C3, C4 connected to the diodes charges or discharges according to the phase shift between the input signal Fo and the reference signal fr. The output signal fd read off between the resistor R1 and the capacitor C4 is a direct current signal which corresponds to the above-named phase shift. The R/C-network R1, R2, C3, C4 decouples the output signal fd from the input signal fo.

The R/C devices, Rk1, C5 and Rk2,C6, connected symmetrically to both ends of the diode network D1,D2 operate as a low pass filter, by which the direct voltages are coupled to the diodes D1,D2. So that the diode pair D1,D2 can conduct the circuit pulse from the step-recoverydiode SRD uneffected (by line capacitance or pulse reflections), it is appropriate to connect the resistors Rk1 and Rk2 to the diodes D1 and D2. The variable resistor R2 connected in parallel with the diode pair D1,D2 operates also to make the voltages on the diodes D1,D2 symmetric.

As can be seen from the drawing the L/C network L1,C1;L2,C2 and the resistors Rsl, Rs2, Rk1, Rk2 are integrated in the module SM in addition to the diodes SRD, D1, D2 and the coupling capacitors Ck1,Ck2. Because of that extremely short connecting conductors and thus very small line inductance and capacitance results. If the circuit should be operated in the GHz region of from 2 to 30 GHz, resistance values cause the frequency response curve or characteristic of the output signal fd to have a very smooth behavior and indeed over a wide frequency range.

The disclosure in German Patent Application 197 03 889.1-35 of Feb. 3, 1997 is incorporated here by reference. This German Patent Application, at least in part, describes the invention described hereinabove and claimed in the claims appended herein in below and provides the basis for a claim of priority for the instant invention under 35 U.S.C. 119.

While the invention has been illustrated and described as embodied in a sampling phase detector, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

1. A sampling phase detector comprising
   a step-recovery-diode (SRD),
   a series circuit connected in parallel to said step-recovery-diode (SRD) by means of coupling capacitors (Ck1, Ck2), said series circuit including at least two diodes (D1,D2) electrically connected in series with each other;
   a balancing transformer for supplying a reference signal (fr) to said step-recovery-diode (SRD), said balancing transformer (Tr) being connected electrically to said step-recovery-diode (SRD) via respective connecting lines;
   a decoupling network for supplying an input signal to said at least two diodes (D1,D2) so that an output signal characteristic of a phase shift between the input signal and the reference signal is read from the at least two diodes; and
   decoupling resistors (Rs1,Rs2) connected in said connecting lines between the step-recovery-diode (SRD) and the balancing transformer;
   wherein resistances of the decoupling resistors (Rs1,Rs2) are selected so that said decoupling resistors (Rs1,Rs2) damp interfering resonances or reflections between the balancing transformer (Tr) and the step-recovery-diode (SRD).

2. The sampling phase detector as defined in claim 1, further comprising an L/C network (L1,C1; L2,C2) connected electrically with the step-recovery-diode (SRD) and wherein said L/C network includes a load resistor (Rp).

3. The sampling phase detector as defined in claim 2, further comprising respective coupling capacitors (Ck1, Ck2) connected in series with said at least two diodes (D1,D2) on respective opposite ends of said series circuit including said at least two diodes and additional resistors (Rk1,Rk2) each connected to a connection point between a respective one of the coupling capacitors (Ck1,Ck2) and the series circuit including the at least two diodes (D1,D2).

4. The sampling phase detector as defined in claim 3, further comprising a common substrate (SM) on which the coupling capacitors (Ck1,Ck2), the at least two diodes (D1,D2), the decoupling resistors (Rs1,Rs2), the L/C network (L1,C1; L2,C2) including the load resistor (Rp) and the step-recovery-diode (SRD) are mounted using film circuit technology.

5. The sampling phase detector as defined in claim 4, wherein said additional resistors (Rk1,Rk2) which are connected to said connection points are mounted on said substrate (SM).

* * * * *